United States Patent
Zhang et al.

(10) Patent No.: US 10,395,746 B2
(45) Date of Patent: Aug. 27, 2019

(54) CORRELATED DOUBLE SAMPLING INTEGRATING CIRCUIT

(71) Applicant: SHENZHEN GOODIX TECHNOLOGY CO., LTD., Shenzhen (CN)

(72) Inventors: Mengwen Zhang, Shenzhen (CN); Chang Zhan, Shenzhen (CN)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 16/139,028

(22) Filed: Sep. 22, 2018

(65) Prior Publication Data
US 2019/0027229 A1    Jan. 24, 2019

Related U.S. Application Data

(63) Continuation of application No. PCT/CN2017/073860, filed on Feb. 17, 2017.

(51) Int. Cl.
*G11C 27/02* (2006.01)
*H03K 5/00* (2006.01)
(Continued)

(52) U.S. Cl.
CPC ........... *G11C 27/026* (2013.01); *H03F 3/005* (2013.01); *H03F 3/45475* (2013.01);
(Continued)

(58) Field of Classification Search
CPC ................................ G11C 27/026; H03M 1/54
(Continued)

(56) References Cited

U.S. PATENT DOCUMENTS

| | | | |
|---|---|---|---|
| 6,750,796 B1 * | 6/2004 | Holloway | H03M 3/494 327/337 |
| 7,075,475 B1 * | 7/2006 | Wan | H03M 3/342 327/337 |

(Continued)

FOREIGN PATENT DOCUMENTS

| | | |
|---|---|---|
| CN | 1485898 A | 3/2004 |
| CN | 1835124 A | 9/2006 |

(Continued)

OTHER PUBLICATIONS

Ali Fazli Yeknami: "Low-Power Delta-Sigma Modulators for Medical Applications", Jan. 1, 2014, XP55183029, ISBN: 978-9-17-519446-2, Retrieved from the Internet: URL: http://urn.kb.se/resolve?urn=urn:nbn:se:liu:diva-102903, figures 4.7, 4.8, and p. 79, line 12-p. 81, line 1.

*Primary Examiner* — Kenneth B Wells

(57) ABSTRACT

A correlated double sampling integrating circuit is provided. The circuit includes: a sampling and holding module, an energy storage unit and a feedback module. The sampling and holding module is configured to perform sampling and holding for different input signals. The energy storage unit is configured to store charges corresponding to the input signals upon the sampling and holding to generate node signals, and the feedback module is configured to form a negative feedback loop with the energy storage unit to control node signals at an integrating stage to keep consistent with node signals at a resetting stage and prevent output jump of the correlated double sampling integrating circuit. The correlated double sampling integrating circuit reduces noise, and prevents or weakens output jump of the correlated double sampling integrating circuit caused by the increase of the count of integrations.

13 Claims, 3 Drawing Sheets

(51) Int. Cl.
*H03K 17/00* (2006.01)
*H03F 3/00* (2006.01)
*H03F 3/45* (2006.01)

(52) U.S. Cl.
CPC .. *H03F 2200/129* (2013.01); *H03F 2200/135* (2013.01); *H03F 2200/156* (2013.01); *H03F 2200/159* (2013.01); *H03F 2200/264* (2013.01); *H03F 2200/375* (2013.01); *H03F 2203/45114* (2013.01); *H03F 2203/45156* (2013.01); *H03F 2203/45171* (2013.01); *H03F 2203/45174* (2013.01)

(58) Field of Classification Search
USPC ...................................................... 327/94–96
See application file for complete search history.

(56) References Cited

U.S. PATENT DOCUMENTS

| | | | | |
|---|---|---|---|---|
| 7,852,124 | B2* | 12/2010 | Lauxtermann | G11C 27/026 327/554 |
| 8,138,804 | B2* | 3/2012 | Chou | H04N 5/378 327/94 |
| 8,841,962 | B1 | 9/2014 | Trampitsch | |
| 2010/0194447 | A1 | 8/2010 | Garrett | |
| 2015/0263750 | A1 | 9/2015 | Lenz | |

FOREIGN PATENT DOCUMENTS

| | | |
|---|---|---|
| CN | 102523394 A | 6/2012 |
| CN | 103023499 A | 4/2013 |
| CN | 104796638 A | 7/2015 |

\* cited by examiner

CORRELATED DOUBLE SAMPLING INTEGRATING CIRCUIT

CROSS-REFERENCE TO RELATED APPLICATIONS

The present application is a continuation of international application No. PCT/CN2017/073860 filed on Feb. 17, 2017, which is hereby incorporated by reference in its entirety.

TECHNICAL FIELD

Embodiments of the present disclosure relate to the technical field of circuits, and in particular, relate to a correlated double sampling integrating circuit.

BACKGROUND

To reduce the 1/f noise of the operational amplifier and the noise caused by mismatch voltages and the like in an integrating circuit, generally the correlated double sampling technology may be introduced. Specifically, different input signals are successively sampled twice, and the input signals upon the twice samplings are subjected to an analogous subtraction, to eliminate the 1/f noise of the operational amplifier and the noise caused by mismatch voltages and the like. In this way, real signal levels are obtained.

An exemplary correlated double sampling integrating circuit includes: a sampling circuit, an energy storage capacitor and an amplifier. The sampling circuit performs time-division based sampling under control of two non-overlap clock signals $\Phi 1$ and $\Phi 2$. When the clock signal $\Phi 1$ is high and the clock signal $\Phi 2$ is low, a positive electrode sheet of the energy storage capacitor Ci samples an input signal V1, and meanwhile a negative electrode sheet thereof may sample the 1/f noise of the operational amplifier and the noise caused by mismatch voltages and the like. When the clock signal $\Phi 1$ is low and the clock signal $\Phi 2$ is high, the positive electrode sheet of the energy storage capacitor Ci samples an input signal V2, and meanwhile the negative electrode sheet thereof may sample the 1/f noise of the operational amplifier and the noise caused by mismatch voltages and the like. If at two contiguous phases, the /f noise of the operational amplifier and the mismatch voltages substantially remain unchanged, with respect to two adjacent sampling time periods, the variation amount of the output voltage of the amplifier is not affected by the 1/f noise and the mismatch voltages, such that /f noise of the operational amplifier and the noise caused by mismatch voltages and the like are eliminated.

However, in the above exemplary correlated double sampling integrating circuit, at the moment the clock signal $\Phi 1$ changes from a low level to a high level, the output of the amplifier may transition from an output value when the clock signal $\Phi 2$ is a high level to a common-mode voltage Vcm. Likewise, at the moment the clock signal $\Phi 2$ changes from a low level to a high level, the output of the amplifier may transition from the common-mode voltage Vcm to a sum of the output value of the original stage of the clock signal $\Phi 2$ and an integration value. Consequently, the output jump of the correlated double sampling integrating circuit become greater and greater as the count of integrations increases.

SUMMARY

Embodiments of the present disclosure are intended to provide a correlated double sampling integrating circuit to at least solve the above problem in the prior art.

To achieve the objective, embodiments of the present disclosure provide a correlated double sampling integrating circuit. The correlated double sampling integrating circuit includes: a sampling and holding module, an energy storage unit and a feedback module; where the sampling and holding module is configured to perform sampling and holding for different input signals, the energy storage unit is configured to store charges corresponding to the input signals upon the sampling and holding to generate node signals, and the feedback module is configured to form a negative feedback loop with the energy storage unit to a control node signal at an integrating stage to keep consistent with a node signal at a resetting stage and prevent output jump of the correlated double sampling integrating circuit.

Optionally, in an embodiment of the present disclosure, the feedback module includes: a differential amplifier and a switch unit, configured to respectively form different negative feedback loops with the energy storage unit to respectively control the node signals generated by the energy storage unit at the integrating stage and the resetting stage, such that the node signal at the integrating stage keep consistent with the node signal at the resetting stage.

Optionally, in an embodiment of the present disclosure, the feedback module includes a first differential amplifier, a second differential amplifier, a first switch unit and a second switch unit; where the first switch unit is turned on and the second switch unit is turned off, such that the second differential amplifier and the first switch unit form a first feedback loop with the energy storage unit, and the first differential amplifier and the second differential amplifier form a second feedback loop with the energy storage unit, to control the node signal generated by the energy storage unit at the resetting stage.

Optionally, in an embodiment of the present disclosure, the feedback module includes a first differential amplifier, a second differential amplifier, a first switch unit and a second switch unit; where the first switch unit is turned off and the second switch unit is turned on, such that the energy storage unit forms a third feedback loop with the first differential amplifier to control the node signal generated by the energy storage unit at the integrating stage.

Optionally, in an embodiment of the present disclosure, the sampling and holding module includes a sampling unit and a holding unit; where the sampling unit is configured to sample the different input signals, and the holding unit is configured to hold the sampled input signals; one terminal of the holding unit is connected to the sampling unit, and the other terminal of the holding unit is respectively connected to one terminal of the first switch unit, one terminal of the energy storage unit and an inverting terminal of the first differential amplifier; and an output terminal of the first differential amplifier and the other terminal of the energy storage unit are respectively connected to a non-inverting terminal and an inverting terminal of the second differential amplifier, the second switch unit is bridged between the non-inverting terminal and the inverting terminal of the second differential amplifier, and the other terminal of the first switch unit is connected to an output terminal of the second differential amplifier.

Optionally, in an embodiment of the present disclosure, the first switch unit and the second switch unit are respectively controlled by two non-overlap clock signals to turn on and turn off.

Optionally, in an embodiment of the present disclosure, the sampling and holding module includes a third switch unit and a fourth switch unit, and is further configured to sample the different input signals under control of the two non-overlap clock signals; where the first switch unit and the third switch unit are simultaneously turned on, and the second switch unit and the fourth switch unit are simultaneously turned off, such that the second differential amplifier and the first switch unit form the first feedback loop with the energy storage unit, and the first differential amplifier and the second differential amplifier form the second feedback loop with the energy storage unit.

Optionally, in an embodiment of the present disclosure, the sampling and holding module includes a third switch unit and a fourth switch unit, and is further configured to sample the different input signals under control of the two non-overlap clock signals; where the first switch unit and the third switch unit are simultaneously turned off, and the second switch unit and the fourth switch unit are simultaneously turned on, such that the energy storage unit first the third feedback loop with the first differential amplifier to control the node signal generated by the energy storage unit at the integrating stage.

Optionally, in an embodiment of the present disclosure, the feedback module includes a single-input and single-output amplifier, a second differential amplifier, a first switch unit and a second switch unit; where the first switch unit is turned on and the second switch unit is turned off, such that the second differential amplifier forms a fourth feedback loop with the first switch unit, and the single-input and single-output amplifier and the second differential amplifier form a fifth feedback loop with the energy storage unit, to control the node signal generated by the energy storage unit at the resetting stage.

Optionally, in an embodiment of the present disclosure, the feedback module includes a single-input and single-output amplifier, a second differential amplifier, a first switch unit and a second switch unit; where the first switch unit is turned off and the second switch unit is turned on, such that the energy storage unit forms a sixth feedback loop with the single-input and single-output amplifier to control the node signals generated by the energy storage unit at the integrating stage.

Optionally, in an embodiment of the present disclosure, the sampling and holding module includes a sampling unit and a holding unit; where the sampling unit is configured to sample the different input signals, and the holding unit is configured to hold the sampled input signals; one terminal of the holding unit is connected to the sampling unit, and the other terminal of the holding unit is respectively connected to one terminal of the first switch unit, an input terminal of the single-input and single-output amplifier and an inverting terminal of the second differential amplifier; an output terminal of the single-input and single-output amplifier is connected to one terminal of the energy storage unit, and the other terminal of the energy storage unit is respectively connected to a non-inverting terminal of the second differential amplifier, the second switch unit is bridged between the non-inverting terminal and an inverting terminal of the second differential amplifier, and the other terminal of the first switch unit is connected to an output terminal of the second differential amplifier.

Optionally, in an embodiment of the present disclosure, the first switch unit and the second switch unit are respectively controlled by two non-overlap clock signals to turn on and turn off.

Optionally, in an embodiment of the present disclosure, the sampling and holding module includes a third switch unit and a fourth switch unit, and is further configured to sample the different input signals under control of the two non-overlap clock signals; where the first switch unit and the third switch unit are simultaneously turned on, and the second switch unit and the fourth switch unit are simultaneously turned off, such that the second differential amplifier forms the fourth feedback loop with the first switch unit, and the single-input and single-output amplifier and the second differential amplifier form the fifth feedback loop with the energy storage unit, to control the node signal generated by the energy storage unit at the resetting stage.

Optionally, in an embodiment of the present disclosure, the sampling and holding module includes a third switch unit and a fourth switch unit and is further configured to sample the different input signals under control of the two non-overlap clock signals; the first switch unit and the third switch unit are simultaneously turned off, and the second switch unit and the fourth switch unit are simultaneously turned on, such that the energy storage unit forms the sixth feedback loop with the single-input and single-output amplifier to control the node signals generated by the energy storage unit at the integrating stage.

Optionally, in an embodiment of the present disclosure, the second switch unit is a second clock-controlled breaker; and/or the first switch unit is a first clock-controlled breaker.

According to embodiments of the present disclosure, the correlated double sampling integrating circuit mainly includes: a sampling and holding module, an energy storage unit and a feedback module; where the sampling and holding module is configured to perform sampling and holding for different input signals, the energy storage unit is configured to store charges corresponding to the input signals upon the sampling and holding to generate node signals (for example, node voltages), and the feedback module is configured to form a negative feedback loop with the energy storage unit to control a node signal at an integrating stage to keep consistent with a node signal at a resetting stage and prevent output jump of the correlated double sampling integrating circuit. The feedback module may include: a differential amplifier and a switch unit, configured to respectively form different negative feedback loops with the energy storage unit to respectively control the node signals generated by the energy storage unit at the integrating stage and the resetting stage, such that the node signals at the integrating stage keep consistent with the node signal at the resetting stage. Therefore, the correlated double sampling integrating circuit eliminates the noise caused by 1/f noise of the operational amplifier and noise caused by mismatch voltage, and prevents or weakens output jump of the correlated double sampling integrating circuit caused by the increase of the count of integrations.

DETAILED DESCRIPTION

Practice of the present application is described in detail with reference to drawings and specific embodiments, such that the practice of addressing the technical problem using the technical means according to the present application and achieving the technical effects may be better understood and conducted.

A correlated double sampling integrating circuit according to the embodiments of the present disclosure mainly includes: a sampling and holding module, an energy storage unit and a feedback module; where the sampling and holding module is configured to perform sampling and holding for different input signals, the energy storage unit is configured to store charges corresponding to the input signals upon the sampling and holding to generate node signals (for example, node voltages), and the feedback module is configured to form a negative feedback loop with the energy storage unit to control node signals at an integrating stage to keep consistent with node signals at a resetting stage and prevent output jump of the correlated double sampling integrating circuit. The feedback module may include: a differential amplifier and a switch unit, configured to respectively form different negative feedback loops with the energy storage unit to respectively control the node signals generated by the energy storage unit at the integrating stage and the resetting stage, such that the node signals at the integrating stage keep consistent with the node signal at the resetting stage. Therefore, the correlated double sampling integrating circuit eliminates the noise caused by 1/f noise of the operational amplifier and noise caused by mismatch voltages, and prevents or weakens output jump of the correlated double sampling integrating circuit caused by the increase of the count of integrations.

In the embodiments hereinafter of the present disclosure, the above correlated sampling circuit is illustratively interpreted with reference to an exemplary specific circuit.

Figure 1:
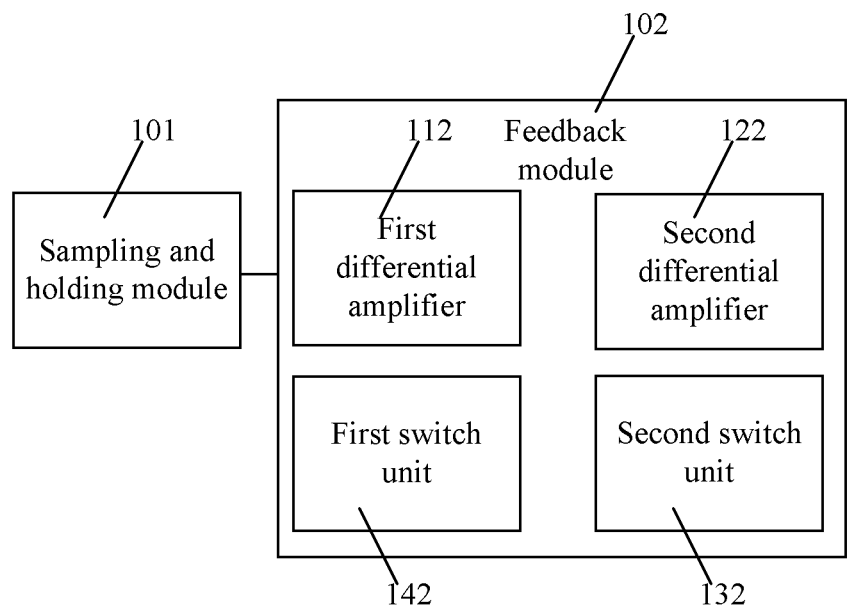
FIG. 1 is a schematic structural diagram of a correlated double sampling integrating circuit according to the first embodiment of the present disclosure.

FIG. 1 is a schematic structural diagram of a correlated double sampling integrating circuit according to the first embodiment of the present disclosure. As illustrated in FIG. 1, the correlated double sampling integrating circuit includes: a sampling and holding module 101 and a feedback module 102. The feedback module 102 includes a first differential amplifier 112, a second differential amplifier 122, a first switch unit 142 and a second switch unit 132. The first switch unit 142 and the second switch unit 132 may be configured to have inverse ON states. For example, when the first switch unit 142 is turned on and the second switch unit 132 is turned off, the second differential amplifier 122 and the first switch unit 142 may form a first feedback loop with an energy storage unit (not shown in the drawings), and the first differential amplifier 112 and the second differential amplifier 122 may form a second feedback loop with the energy storage unit, to control node signals generated by the energy storage unit at a resetting stage. When the first switch unit 142 is turned off and the second switch unit 132 is turned on, the energy storage unit forms a third feedback loop with the first differential amplifier 112 to control node signals generated by the energy storage unit at an integrating stage. Therefore, the correlated double sampling integrating circuit according to this embodiment may enable the node signals at the integrating stage to be consistent with the node signals at the resetting stage. The correlated double sampling integrating circuit eliminates the noise caused by 1/f noise of the operational amplifier and noise caused by mismatch voltages, and prevents or weakens output jump of the correlated double sampling integrating circuit caused by the increase of the count of integrations.

Figure 2:
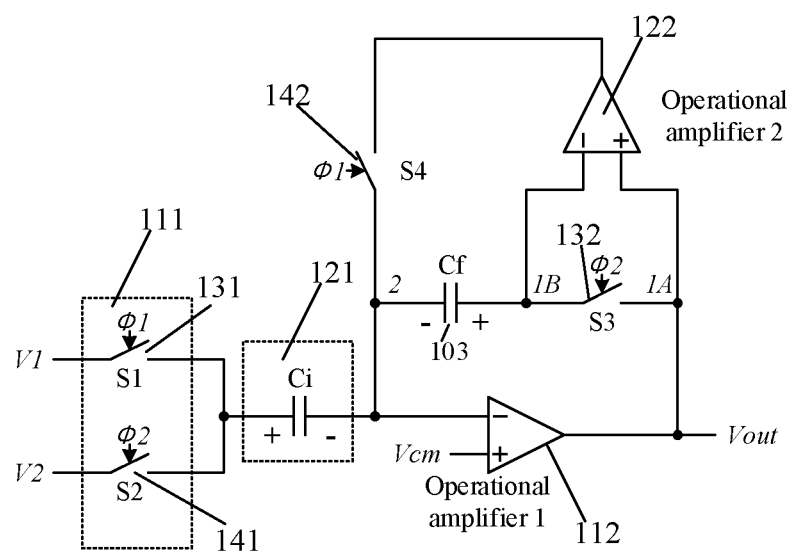
FIG. 2 is a specific schematic structural diagram of a correlated double sampling integrating circuit according to the second embodiment of the present disclosure.

FIG. 2 is a specific schematic structural diagram of a correlated double sampling integrating circuit according to the second embodiment of the present disclosure. As illustrated in FIG. 2, in this embodiment, the first differential amplifier 112 is also marked as an operational amplifier 1, and the second differential amplifier 122 is also marked as an operational amplifier 2, wherein:

The sampling and holding module includes a sampling unit 111 and a holding unit 121. The sampling unit 111 is configured to respectively sample different input signals (V1 and V2). The holding unit 121 (for example, a holding capacitor Ci) is configured to hold the sampled input signals. One terminal of the holding unit 121 is connected to the sampling unit 111, and the other terminal of the holding unit 121 is respectively connected to one terminal of the first switch unit 142 (also marked as S4), one terminal of an energy storage unit 103 (for example, the energy storage capacitor Cf in the drawings) and an inverting terminal of the first differential amplifier 112. An output terminal of the first differential amplifier 112 and the other terminal of the energy storage unit 103 are respectively connected to a non-inverting terminal and an inverting terminal of the second differential amplifier 122. The second switch unit 132 (also marked as S3) is bridged between the non-inverting terminal and the inverting terminal of the second differential amplifier 122. The other terminal of the first switch unit 142 is connected to an output terminal of the second differential amplifier 122.

In this embodiment, specifically inverse ON states of the first switch unit 142 and the second switch unit 132 may be respectively controlled by two non-overlap clock signals Φ1 and Φ2.

Further, in this embodiment, the sampling and holding module 101 specifically includes a third switch unit 131 (also marked as S1) and a fourth switch unit 141 (also marked as S2). The third switch unit 131 and the fourth switch unit 141 may be configured to have inverse ON states. Specifically, for example, the inverse ON states of the third switch unit 131 and the fourth switch unit 141 may also be controlled by the above two non-overlap clock signals Φ1 and Φ2. That is, the two non-overlap clock signals Φ1 and Φ2 respectively control the third switch unit 131 and the fourth switch unit 141 to make a turn-on or turn-off action, such that the third switch unit 131 and the fourth switch unit 141 have the inverse ON states to sample the input signal V1. Meanwhile, the first switch unit 142 and the third switch unit 131 are synchronously turned on, the second switch unit 132 and the fourth switch unit 141 are synchronously turned off, such that the second differential amplifier 122 and the first switch unit 142 form a first feedback loop with the energy storage unit 103, and the first differential amplifier 112 and the second differential amplifier 122 form a second feedback loop with the energy storage unit 103, to control the node signals generated by the energy storage unit 103 at the resetting stage.

Further, the two non-overlap clock signals Φ1 and Φ2 respectively control the third switch unit 131 and the fourth switch unit 141 to make a turn-on or turn-off action such that the third switch unit 131 and the fourth switch unit 141 have different ON states to sample the input signal V2. Meanwhile, the first switch unit 142 and the third switch unit 131 are synchronously turned off, and the second switch unit 132 and the fourth switch unit 141 are synchronously turned on, such that the energy storage unit 103 forms a third feedback loop with the first differential amplifier 112 to control the node signals generated by the energy storage unit 103 at the integrating stage, such that the node signals at the integrating stage keep consistent with the node signals at the resetting stage.

In an optional embodiment, for example, a stage where the clock signal Φ1 is high and the clock signal Φ2 is low is defined as the resetting stage, and a stage where the clock signal Φ1 is low and the clock signal Φ2 is high is defined as the integrating stage. In one aspect assume that the 1/f noise of the operational amplifier and the noise caused by mismatch voltages and the like are not considered, and in another aspect assume that a gain of the second differential amplifier 122 is 1, an initial charge of the energy storage capacitor is 0 and a common-mode voltage Vcm is 0; and correspondingly, the correlated double sampling integrating circuit in this embodiment operates as follows:

At the first resetting stage, the clock signal Φ1 is high and the clock signal Φ2 is low, such that the third switch unit 131 and the first switch unit 142 are both turned on, and the fourth switch unit 141 and the second switch unit 132 are both turned off. In this case, two terminals of the energy storage unit 103 are bridged between the inverting terminal and the output terminal of the second differential amplifier 122, such that the first negative feedback loop is formed. In this case, the charges injected into a node 2 may be all absorbed by the second differential amplifier 122. However, since the third switch S3 is turned off, the charges injected into the node 2 may not be transferred to the energy storage unit 103, such that the charges in the energy storage unit 103 are held. That is, regardless of how the voltage at a positive electrode sheet of the holding unit 121 changes, the output Vout of the integrating circuit may not be affected. In addition, since the first differential amplifier 112 and the second differential amplifier 122 form the second negative feedback loop with the energy storage unit 103, and the second differential amplifier 122 is in a virtually shorted state, the voltage at the node 2 is equal to the common-mode voltage Vcm and is 0 V. Therefore, the voltage at a negative electrode sheet of the energy storage unit 103 is 0, the voltage at a negative electrode sheet of the holding unit 121 is also 0, and the voltage at a positive electrode sheet of the holding unit 121 is the voltage of the output signal V1.

At the first integrating stage, the fourth switch unit 141 and the second switch unit 132 are both turned on, and the third switch unit 131 and the first switch unit 142 are both turned off. In this case, the second differential amplifier 122 is removed from the loop, the two terminals of the energy storage unit 103 are respectively bridged between the inverting terminal and the output terminal of the first differential amplifier 112, such that a third negative feedback loop is formed. In this case, the charges injected into the node 2 may be absorbed by the energy storage unit 103. In this case, the input signal V1 at the positive electrode sheet of the holding unit 121 is changed to the input signal V2. Therefore, the output Vout of the integrating circuit may be calculated according to formula (1).

$$V_{out} = (V_1 - V_2)\frac{C_i}{C_f}, \qquad (1).$$

At a second resetting stage, similar to the first resetting stage, the charges in the energy capacitor Cf are not affected by the changes of the voltage at the positive electrode sheet of the holding unit 121. Therefore, the voltage at a node 1B at this time is (V1−V2) Ci/Cf. Since the second differential amplifier 122 is virtually shorted, the voltages at the nodes 1B and 1A are consistent, which are both equal to the common-mode voltage Vcm. Therefore, the output Vout of the integrating circuit is equal to the output Vout of the integrating circuit at the first integrating stage, that is, the output Vout of the integrating circuit is determined according to formula (1).

Considering the 1/f noise of the operational amplifier and the noise δV(T) caused by mismatch voltages and the like, the noise δV(T) may be equivalent to the input signal. Referring to formula (1), upon the first integrating stage, the output Vout of the integrating circuit is given according to formula (2).

$$V_{out} = \left\{(V_1 - V_2) + \left[\delta V(T) - \delta V\left(\frac{T}{2}\right)\right]\right\}\frac{C_i}{C_f} \qquad (2)$$

where T is a clock cycle.

According to formula (2), since a small interval is defined between the integrating stage and the resetting stage, it that the noise δV(T) and the noise $$\delta V\left(\frac{T}{2}\right)$$

are the same, and $$\delta V(T) - \delta V\left(\frac{T}{2}\right)$$

in formula (2) is approximately 0, such that the output Vout of the integrating circuit is not affected by the noise δV(T).

Figure 3:
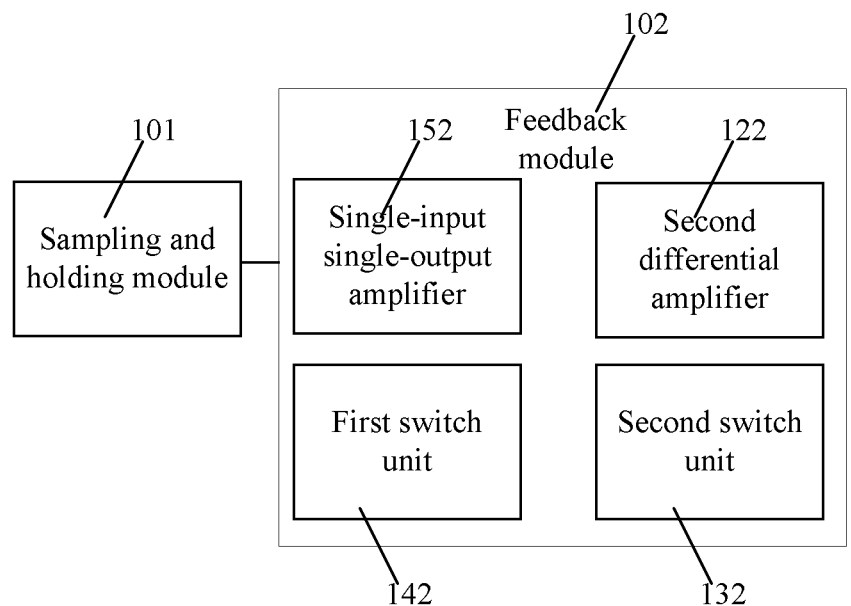
FIG. 3 is a schematic structural diagram of a correlated double sampling integrating circuit according to the third embodiment of the present disclosure.
Figure 4:
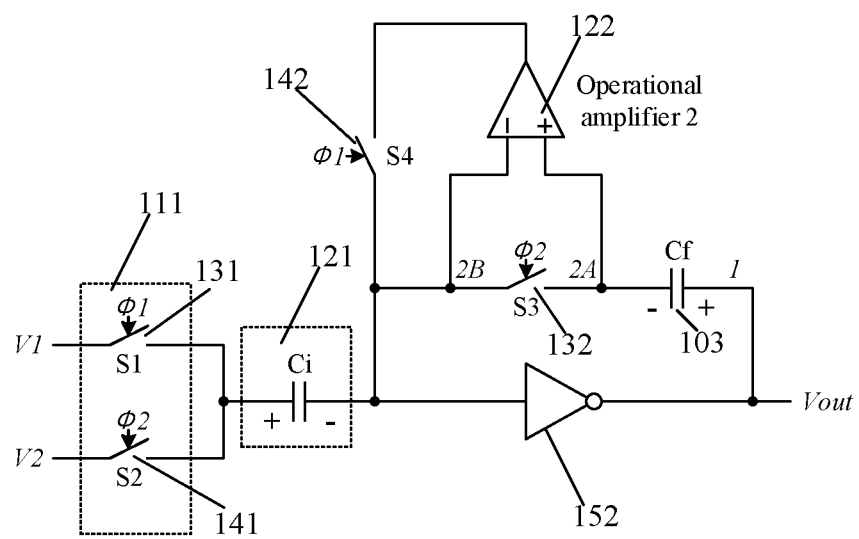
FIG. 4 is a specific schematic structural diagram of a correlated double sampling integrating circuit according to the fourth embodiment of the present disclosure.

FIG. 3 is a schematic structural diagram of a correlated double sampling integrating circuit according to the third embodiment of the present disclosure. FIG. 4 is a specific schematic structural diagram of a correlated double sampling integrating circuit according to the fourth embodiment of the present disclosure. As illustrated in FIG. 3 and FIG. 4, in this embodiment, the correlated double sampling integrating circuit includes: a feedback module 102 and a sampling and holding module 101, wherein:

The feedback module 102 includes a single-input and single-output amplifier 152, a second differential amplifier 122, a first switch unit 142 and a second switch unit 132. The first switch unit 142 is turned on and the second switch unit 132 is turned off, such that the second differential amplifier 122 forms a fourth feedback loop with the first switch unit 142, and the single-input and single-output amplifier 152 and the second differential amplifier 122 form a fifth feedback loop with the energy storage unit 103, to control the node signals generated by the energy storage unit 103 at the resetting stage. Further, the first switch unit 142 is turned off and the second switch unit 132 is turned on, such that the energy storage unit 103 forms a sixth feedback loop with the single-input and single-output amplifier 152 to control node signals generated by the energy storage unit 103 at the integrating stage. In this embodiment, ON and OFF states of the first switch unit 142 and the second switch unit 132 may be respectively controlled by the two non-overlap clock signals Φ1 and Φ2.

The sampling and holding module 101 also includes a sampling unit 111 and a holding unit 121. The sampling unit 111 is configured to sample the different input signals (V1 and V2), and the holding unit 121 is configured to hold the sampled input signals. Specifically, one terminal of the holding unit 121 is respectively connected to the sampling unit 111, and the other terminal of the holding unit 121 is respectively connected to one terminal of the first switch unit 142, an input terminal of the single-input and single-output amplifier 152 and an inverting terminal of the second differential amplifier 122. An output terminal of the single-input and single-output amplifier 152 is connected to one terminal (the positive electrode sheet terminal) of the energy storage unit 103, and the other terminal (the negative electrode sheet terminal) of the energy storage unit 103 is respectively connected to a non-inverting terminal of the second differential amplifier 122. The second switch unit 132 is bridged between the non-inverting terminal and the inverting terminal of the second differential amplifier 122, and the other terminal of the first switch unit 142 is connected to an output terminal of the second differential amplifier 122.

Specifically, the sampling and holding module 101 includes a third switch unit 131 and a fourth switch unit 141. The third switch unit 131 and the fourth switch unit 141 are configured to switch on or switch off under control of the two non-overlap signals Φ1 and Φ2 to sample the input signal V1. Meanwhile, the first switch unit 142 and the third switch unit 131 are simultaneously turned on and off, and the second switch unit 132 and the fourth switch unit 142 are simultaneously turned off, such that the second differential amplifier 122 forms the fourth feedback loop with the first switch unit 142, and the single-input and single-output amplifier 152 and the second differential amplifier 122 form the fifth feedback loop with the energy storage unit 103, to control the node signals generated by the energy storage unit 103 at the resetting stage. Further, the third switch unit 131 and the fourth switch unit 141 are further configured to sample the input signal V2 under control of the two non-overlap clock signals Φ1 and Φ2. Meanwhile, the first switch unit 142 and the third switch unit 131 are simultaneously turned off, and the second switch unit 132 and the fourth switch unit 141 are simultaneously turned on, such that the energy storage unit 103 forms the sixth feedback loop with the single-input and single-output amplifier 152 to control the node signals generated by the energy storage unit 103 at the integrating stage.

In this embodiment, the second switch unit 132 arranged between the negative electrode sheet of the energy storage capacitor and the inverting terminal of the single-input and single-output amplifier 152 results in two nodes: a node 2A and a node 2B. It is equivalent that two nodes are inserted. Since the second differential amplifier 122 is virtually shorted, the voltages (the node signals) at the nodes 2A and 2B are both equal to the common-mode voltage Vcm, which are substantially maintained to be constant, such that the node signals at the nodes 2A and 2B constantly vary with the variation of the count of integrations. In this way, the noise caused by 1/f noise of the operational amplifier and noise caused by mismatch voltage are eliminated, and output jump of the correlated double sampling integrating circuit caused by the increase of the count of integrations are prevented or weakened.

In addition, different from the second embodiment as described above, the above first differential amplifier is replaced with the single-input and single-output amplifier 152, and a common-mode voltage Vcm is generated inside the single-input and single-output amplifier 152, such that power consumption and noise are further reduced.

Still further, since the turn-on or turn-off action of the second switch unit 132 at the integrating stage is inverse to the turn-on or turn-off action of the second switch unit 132 at the holding stage, such that the charge injection effects are inverse. With respect to the energy storage capacitor, since the inject effects within a cycle may cause differences to the charges therein, the energy storage capacitor in each cycle may have some remaining charges. In an ideal condition, the energy storage capacitor has no remaining charges within each cycle. However, since the amounts of the remaining charges within various cycles are almost the same or no charges remain, the charge inject effects may not affect linearity of the integrating circuit.

Figure 5:
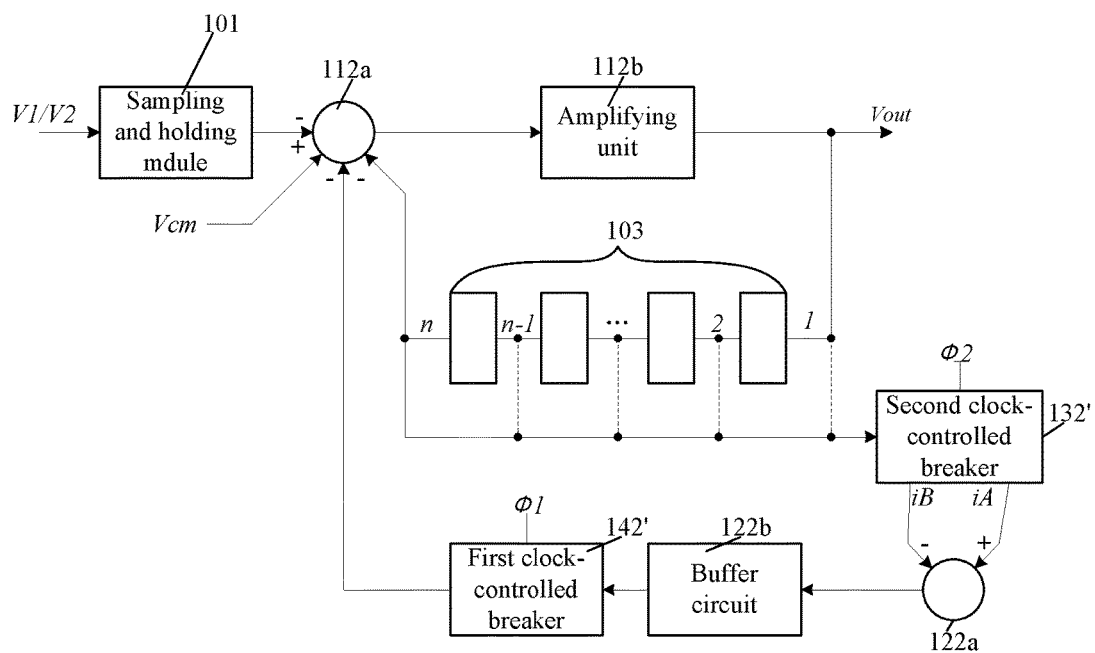
FIG. 5 is a block diagram of a correlated double sampling integrating circuit according to the fifth embodiment of the present disclosure.

FIG. 5 is a block diagram of a correlated double sampling integrating circuit according to the fifth embodiment of the present disclosure. As illustrated in FIG. 5, the correlated double sampling integrating circuit includes: a sampling and holding module 101 and a feedback module 102. The feedback module 102 includes: a first adder 112a, an amplifying unit 112b, a plurality of energy storage units 103, a second clock-controlled breaker 132', a second adder 122a, a buffer circuit 122b and a first clock-controlled breaker 142'. A combination of the first adder 112a and the amplifying unit 112b is equivalent to the first differential amplifier. The second clock-controlled breaker 132' is equivalent to the second switch unit 132. The first clock-controlled breaker 142' is equivalent to the first switch unit 142. A combination of the second adder 122a and the buffer circuit 122b is equivalent to the second differential amplifier 122. The second clock-controlled breaker 132' may be connected to an ith cascaded node (i=1, 2, . . . , n) of any of the plurality of energy storage units 103, which is equivalent to splitting the cascaded node to which the second clock-controlled breaker 132' is connected into two nodes: a node iB (for example, a node 2b), and a node iA (for example, a node 2A). For example, as illustrated in FIG. 5, if the second clock-controlled breaker 132' is connected to the cascaded node 3, it is signified that the cascaded node 3 is split into a node 3B and a node 3A via the second clock-controlled breaker 132', such that by means of the feedback module 102, the node signals at the nodes iB and iA may be controlled to not vary with the variation of the count of integrations. In this way, the noise caused by 1/f noise of the operational amplifier and noise caused by mismatch voltage are eliminated, and output jump of the correlated double sampling integrating circuit caused by the increase of the count of integrations are prevented or weakened.

The operation process of the correlated double sampling integration as illustrated in FIG. 5 is briefly described hereinafter. The detail process may be referenced to the above relevant disclosure of the embodiments.

At a first resetting stage, in the sampling unit 111, the third switch unit (not shown in the drawings) and the first clock-controlled breaker 142' are turned on, the fourth switch unit (not shown in the drawings) and the second clock-controlled breaker 132' are turned off. In this case, two terminals of the energy storage unit 103 are bridged between an inverting terminal and an amplification output terminal of the first adder 112a, such that the first negative feedback loop is formed; and the first adder 112a, the amplifying unit 112b, the adder 122a and the energy storage unit 103 form the second negative feedback loop.

At a first integrating stage, in the sampling unit 111, the fourth switch unit (not shown in the drawings) and the second clock-controlled breaker 132' are turned on, and the third switch unit (not shown in the drawings) and the first clock-controlled breaker 142' are turned off. In this case, the second adder 122a is removed from the loop, and the two terminals of the energy storage unit 103 are respectively bridged between an inverting terminal and a non-inverting terminal of the second adder 122a, such that the above third negative feedback loop is formed.

It should be noted that the circuit modules or circuit units in the above embodiments may be individual devices or may be combinations of a plurality of devices, as long as the above functions may be implemented thereby.

The apparatus according to the embodiments of the present application may be practiced by a computer program. A person skilled in the art should understand the above division of units and modules is only an exemplary one, and if the apparatus is divided into other units or modules or not divided, the technical solution shall also fall within the protection scope of the present application as long as the information object has the above functions.

A person skilled in the art shall understand that the embodiments of the present application may be described to illustrate methods, apparatuses (devices), or computer program products. Therefore, hardware embodiments, software embodiments, or hardware-plus-software embodiments may be used to illustrate the present application. In addition, the present application may further employ a computer program product which may be implemented by at least one non-transitory computer-readable storage medium with an executable program code stored thereon. The non-transitory computer-readable storage medium comprises but not limited to a disk memory, a CD-ROM, and an optical memory.

The present disclosure is described based on the flowcharts and/or block diagrams of the method, apparatus (device), and computer program product. It should be understood that each process and/or block in the flowcharts and/or block diagrams, and any combination of the processes and/or blocks in the flowcharts and/or block diagrams may be implemented using computer program instructions. These computer program instructions may be issued to a computer, a dedicated computer, an embedded processor, or processors of other programmable data processing device to generate a machine, which enables the computer or the processors of other programmable data processing devices to execute the instructions to implement an apparatus for implementing specific functions in at least one process in the flowcharts and/or at least one block in the block diagrams.

These computer program instructions may also be stored a non-transitory computer-readable memory capable of causing a computer or other programmable data processing devices to work in a specific mode, such that the instructions stored on the non-transitory computer-readable memory implement a product comprising an instruction apparatus, where the instruction apparatus implements specific functions in at least one process in the flowcharts and/or at least one block in the block diagrams.

These computer program instructions may also be stored on a computer or other programmable data processing devices, such that the computer or the other programmable data processing devices execute a series of operations or steps to implement processing of the computer. In this way, the instructions, when executed on the computer or the other programmable data processing devices, implement the specific functions in at least one process in the flowcharts and/or at least one block in the block diagrams.

Although the preferred embodiments of the present application are described above, once knowing the basic creative concept, a person skilled in the art can make other modifications and variations to these embodiments. Therefore, the appended claims are intended to be construed as covering the preferred embodiments and all the modifications and variations falling within the scope of the present application. Obviously, a person skilled in the art can make various modifications and variations to the present application without departing from the spirit and scope of the present application. In this way, the present application is intended to cover the modifications and variations if they fall within the scope of the appended claims of the present application and equivalent technologies thereof.

What is claimed is:

1. A correlated double sampling integrating circuit, comprising a sampling and holding module, an energy storage unit and a feedback module;

wherein the sampling and holding module is configured to sample and hold different input signals;

the energy storage unit is configured to store charge corresponding to the input signals that are sampled and held to generate node signals; and the feedback module is configured to form a negative feedback loop with the energy storage unit to control a node signal at an integrating stage to be substantially equal to a node signal at a resetting stage, wherein the feedback module comprises a differential amplifier unit and a switch unit, configured to respectively form different negative feedback loops with the energy storage unit to respectively control the node signals generated by the energy storage unit at the integrating stage and the resetting stage, such that the node signal at the integrating stage is substantially equal to the node signal at the resetting stage, wherein the differential amplifier unit comprises a second differential amplifier and one of a first differential amplifier and a single-input and single-output amplifier, and the switch unit includes a first switch unit and a second switch unit, when the first switch unit is turned on and the second switch unit is turned off, the second differential amplifier and the first switch unit form a first feedback loop with the energy storage unit, and the second differential amplifier and one of the first differential amplifier and the single-input and single-output amplifier form a second feedback loop with the energy storage unit, to control the node signal generated by the energy storage unit at the resetting stage.

2. The circuit according to claim 1, when the first switch unit is turned off and the second switch unit is turned on, the energy storage unit forms a third feedback loop with one of the first differential amplifier and the single-input and single-output amplifier to control the node signal generated by the energy storage unit at the integrating stage.

3. The circuit according to claim 1, wherein the sampling and holding module comprises a sampling unit and a holding unit; wherein the sampling unit is configured to sample the different input signals, and the holding unit is configured to hold the sampled input signals; one terminal of the holding unit is connected to the sampling unit, and the other terminal of the holding unit is respectively connected to one terminal of the first switch unit, one terminal of the energy storage unit and an inverting terminal of the first differential amplifier; and an output terminal of the first differential amplifier and the other terminal of the energy storage unit are respectively connected to a non-inverting terminal and an inverting terminal of the second differential amplifier, the second switch unit is bridged between the non-inverting terminal and the inverting terminal of the second differential amplifier, and the other terminal of the first switch unit is connected to an output terminal of the second differential amplifier.

4. The circuit according to claim 1, wherein the first switch unit and the second switch unit are respectively controlled by two non-overlap clock signals to turn on and turn off.

5. The circuit according to claim 4, wherein the sampling and holding module comprises a third switch unit and a fourth switch unit, and is further configured to sample the different input signals under control of the two non-overlap clock signals; wherein the first switch unit and the third switch unit are simultaneously turned on, and the second switch unit and the fourth switch unit are simultaneously turned off, such that the second differential amplifier and the first switch unit form the first feedback loop with the energy storage unit, the second differential amplifier and one of the first differential amplifier and the single-input and single-output amplifier form the second feedback loop with the energy storage unit.

6. The circuit according to claim 4, wherein the sampling and holding module comprises a third switch unit and a fourth switch unit, and is further configured to sample the different input signals under control of the two non-overlap clock signals; wherein the first switch unit and the third switch unit are simultaneously turned off, and the second switch unit and the fourth switch unit are simultaneously turned on, such that the energy storage unit forms the third feedback loop with one of the first differential amplifier and the single-input and single-output amplifier to control the node signals generated by the energy storage unit at the integrating stage.

7. The circuit according to claim 1, wherein the differential amplifier unit comprises the single-input and single-output amplifier when the first switch unit is turned on and the second switch unit is turned off, such that the second differential amplifier forms a fourth feedback loop with the first switch unit, and the single-input and single-output amplifier and the second differential amplifier form a fifth feedback loop with the energy storage unit, to control the node signal generated by the energy storage unit at the resetting stage.

8. The circuit according to claim 1, wherein the differential amplifier unit comprises the single-input and single-output amplifier when the first switch unit is turned off and the second switch unit is turned on, such that the energy storage unit forms a sixth feedback loop with the single-input and single-output amplifier to control the node signal generated by the energy storage unit at the integrating stage.

9. The circuit according to claim 7, wherein the sampling and holding module comprises a sampling unit and a holding unit; wherein the sampling unit is configured to sample the different input signals, and the holding unit is configured to hold the sampled input signals; one terminal of the holding unit is connected to the sampling unit, and the other terminal of the holding unit is respectively connected to one terminal of the first switch unit, an input terminal of the single-input and single-output amplifier and an inverting terminal of the second differential amplifier; an output terminal of the single-input and single-output amplifier is connected to one terminal of the energy storage unit, and the other terminal of the energy storage unit is respectively connected to a non-inverting terminal of the second differential amplifier, the second switch unit is bridged between the non-inverting terminal and an inverting terminal of the second differential amplifier, and the other terminal of the first switch unit is connected to an output terminal of the second differential amplifier.

10. The circuit according to claim 7, wherein the first switch unit and the second switch unit are respectively controlled by a two non-overlap clock signals to turn on and turn off.

11. The circuit according to claim 10, wherein the sampling and holding module comprises a third switch unit and a fourth switch unit, and is further configured to sample the different input signals under control of the two non-overlap clock signals; wherein the first switch unit and the third switch unit are simultaneously turned on, and the second switch unit and the fourth switch unit are simultaneously turned off, such that the second differential amplifier forms the fourth feedback loop with the first switch unit, and the single-input and single-output amplifier and the second differential amplifier form the fifth feedback loop with the energy storage unit, to control the node signal generated by the energy storage unit at the resetting stage.

12. The circuit according to claim 10, wherein the sampling and holding module comprises a third switch unit and a fourth switch unit, and is further configured to sample the different input signals under control of the two non-overlap clock signals; the first switch unit and the third switch unit are simultaneously turned off, and the second switch unit and the fourth switch unit are simultaneously turned on, such that the energy storage unit forms the sixth feedback loop with the single-input and single-output amplifier to control the node signal generated by the energy storage unit at the integrating stage.

13. The circuit according to claim 1, wherein:
the second switch unit is a second clock-controlled breaker; and/or
the first switch unit is a first clock-controlled breaker.

* * * * *